United States Patent [19]

Matsufuji

[11] Patent Number: 5,761,702

[45] Date of Patent: Jun. 2, 1998

[54] RECORDING APPARATUS INCLUDING A PLURALITY OF EEPROMS WHERE PARALLEL ACCESSING IS USED

[75] Inventor: Katsuaki Matsufuji, Tenri, Japan

[73] Assignee: Sharp Kabushiki Kaisha, Osaka, Japan

[21] Appl. No.: 683,913

[22] Filed: Jul. 19, 1996

Related U.S. Application Data

[63] Continuation of Ser. No. 183,371, Jan. 19, 1994, abandoned.

[30] Foreign Application Priority Data

Jun. 30, 1993 [JP] Japan ................ 5-161618
Sep. 29, 1993 [JP] Japan ................ 5-242983

[51] Int. Cl.⁶ .................................. G06F 12/02
[52] U.S. Cl. .................... 711/103; 711/168; 365/230.04
[58] Field of Search .................... 395/430, 482; 365/185.33, 189.04, 230.03, 230.04; 711/168, 103, 169

[56] References Cited

U.S. PATENT DOCUMENTS

| | | |
|---|---|---|
| 4,566,080 | 1/1986 | Fang et al. ............... 365/185 |
| 4,578,777 | 3/1986 | Fang et al. ............... 365/184 |
| 4,984,191 | 1/1991 | Vermessse ............... 395/425 |
| 5,057,924 | 10/1991 | Yamada et al. ............ 358/209 |
| 5,337,281 | 8/1994 | Kobayashi et al. ........ 365/218 |
| 5,375,222 | 12/1994 | Robinson et al. ......... 395/430 |
| 5,442,768 | 8/1995 | Sudoh et al. ............ 395/430 |
| 5,535,369 | 7/1996 | Wells et al. ........... 395/497.02 |
| 5,579,502 | 11/1996 | Konishi et al. .......... 395/430 |

FOREIGN PATENT DOCUMENTS 2-238500  9/1990  Japan.

*Primary Examiner*—Eddie P. Chan
*Assistant Examiner*—Hiep T. Nguyen

[57] ABSTRACT

A recording apparatus includes a plurality of EEPROMs. For example, one of the EEPROMs is for main recording and other EEPROMs are for standby recording. These EEPROMs include two recording regions which can be erased independently from each other. The erasing and writing from the respective EEPROMs can be done at the same time in parallel operation, thus enabling recording by eliminating a waiting time for erasure.

8 Claims, 13 Drawing Sheets

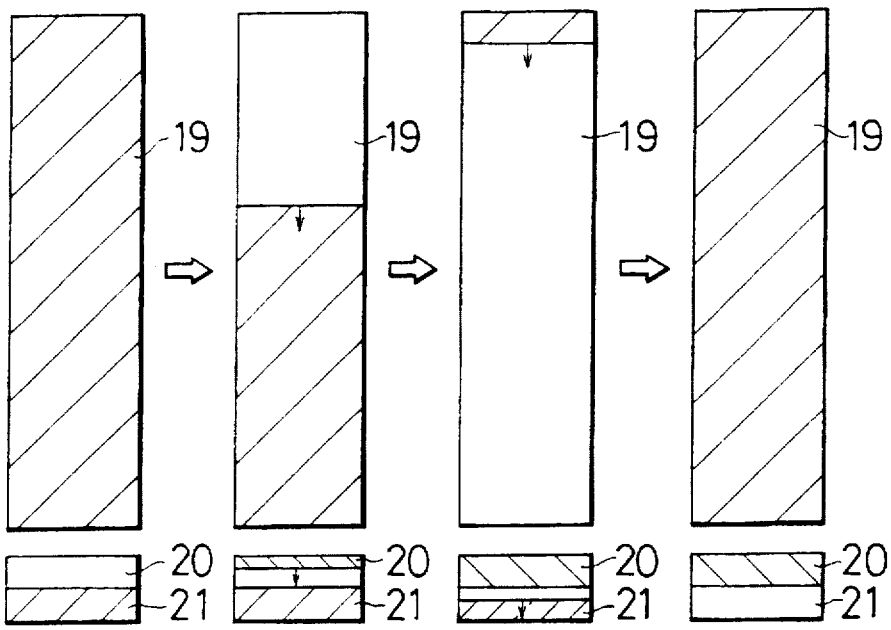
Fig. 3(a)
UPON
COMPLETION
OF RECORDING
Fig. 3(b)
RECORDING OF
STANDBY
EEPROMa,
ERASURE OF
MAIN EEPROM
Fig. 3(c)
RECORDING OF
MAIN
EEPROM,
ERASURE OF
STANDBY
EEPROMb
Fig. 3(d)
COMPLETION OF
RECORDING
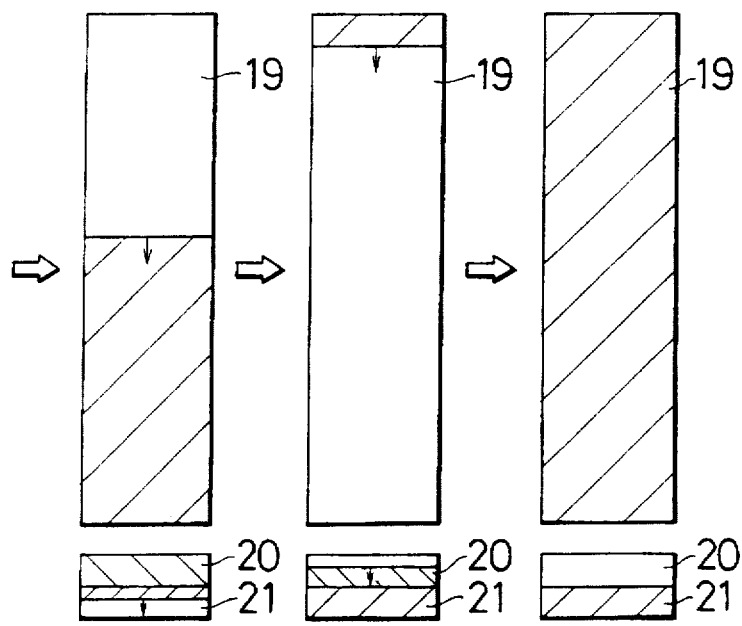
Fig. 3(e)
RECORDING OF
STANDBY
EEPROMb,
ERASURE OF
MAIN EEPROM
Fig. 3(f)
RECORDING OF
MAIN EEPROM,
ERASURE OF
STANDBY
EEPROMa
Fig. 3(g)
COMPLETION
OF RECORDING

PARALLEL PROCESSING OF RECORDING OF
STANDBY EEPROM AND ERASURE OF MAIN EEPROM

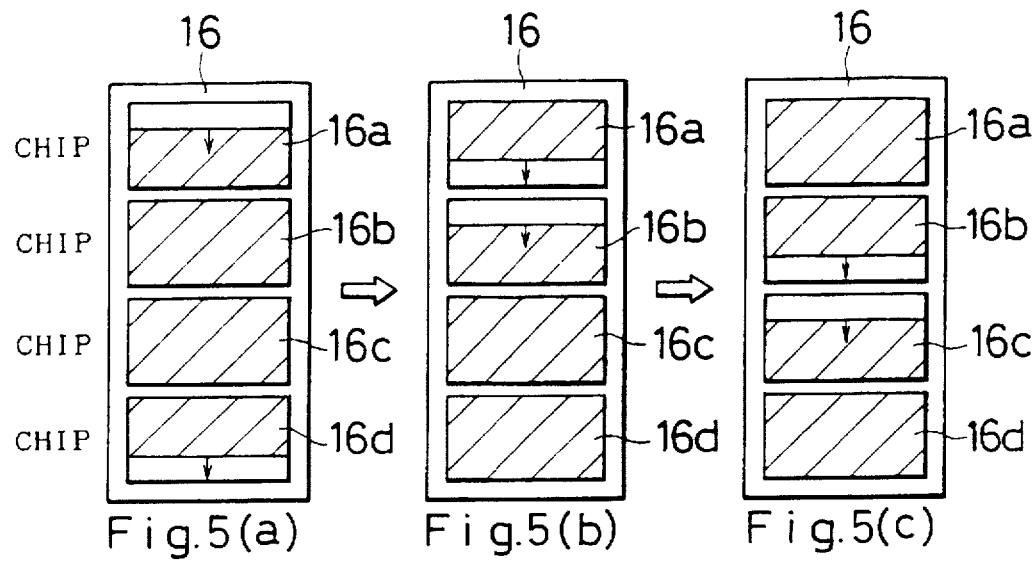
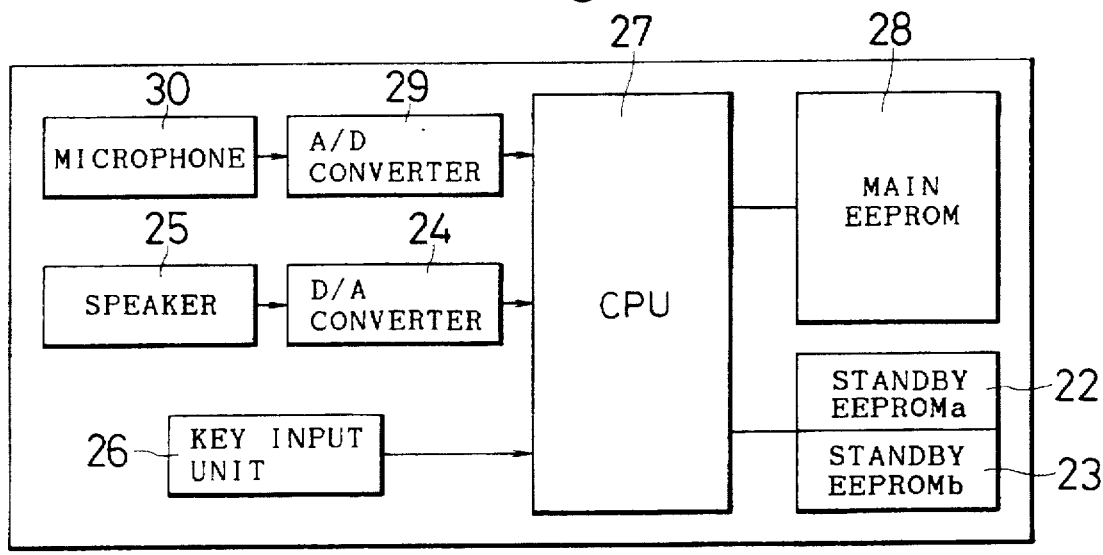

Fig.9
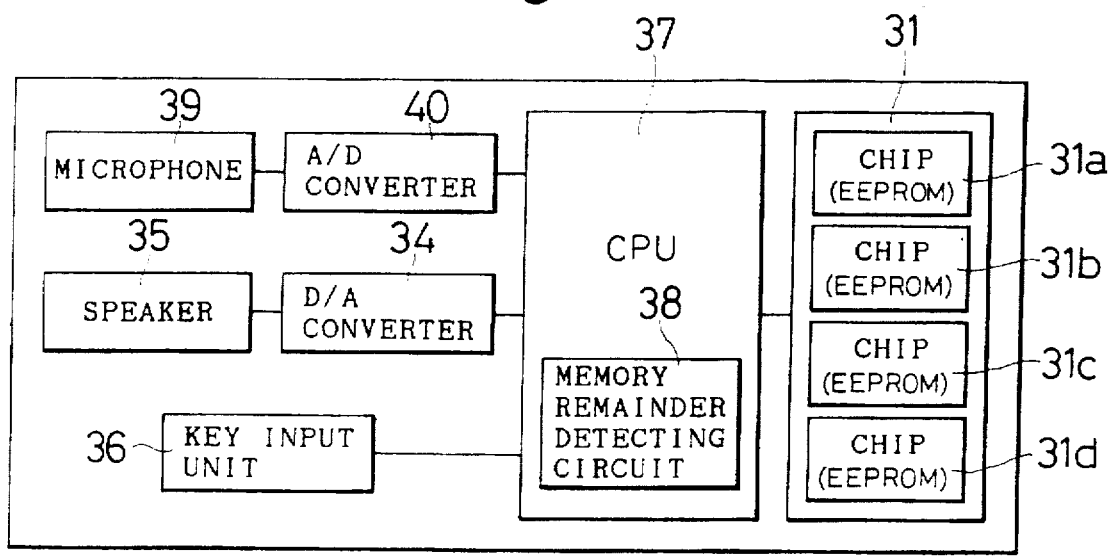
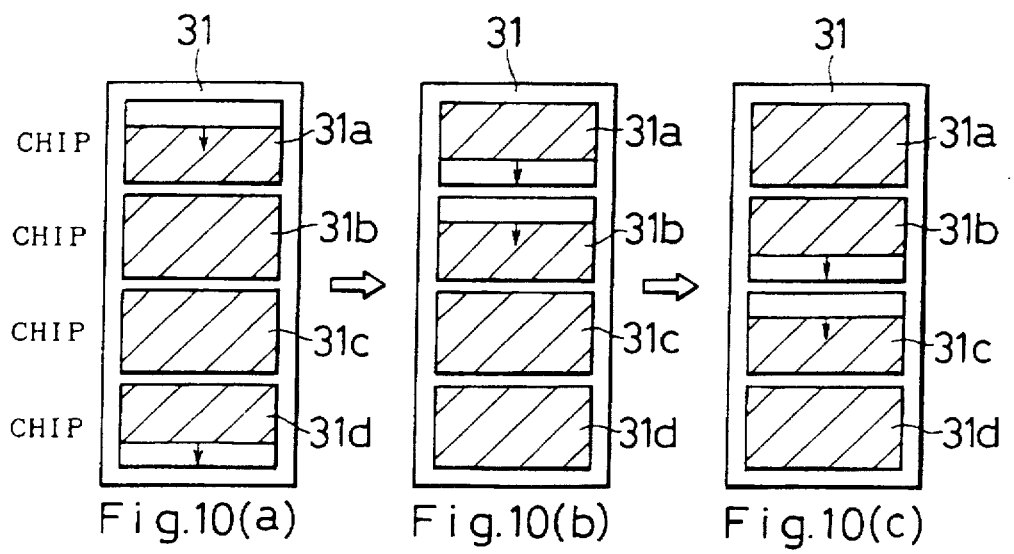
Fig.10(a)   Fig.10(b)   Fig.10(c)

BLOCK ERASING METHOD

BYTE WRITING METHOD

Fig. 17
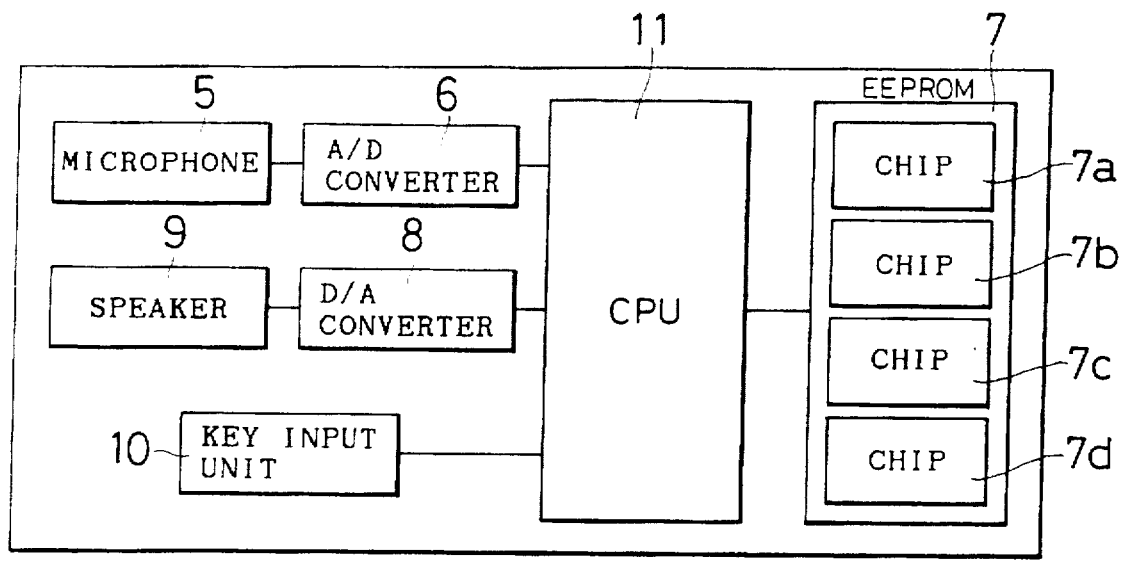
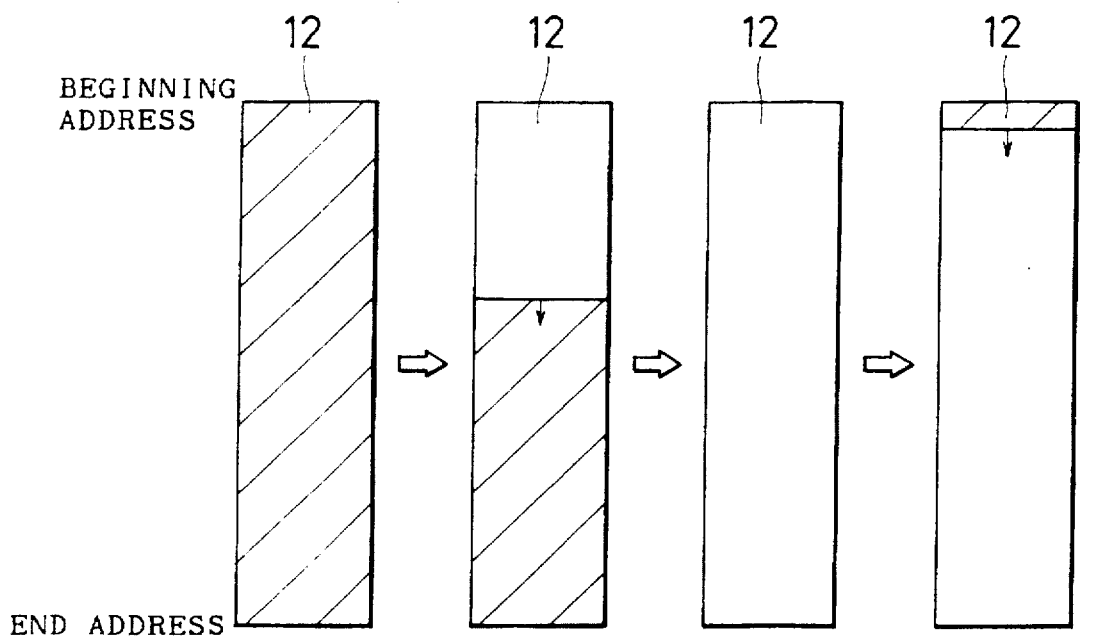
Fig. 18(a)
UPON
COMPLETION
OF RECORDING
Fig. 18(b)
DURING
ERASURE
Fig. 18(c)
UPON
COMPLETION
OF ERASURE
Fig. 18(d)
START OF
RECORDING

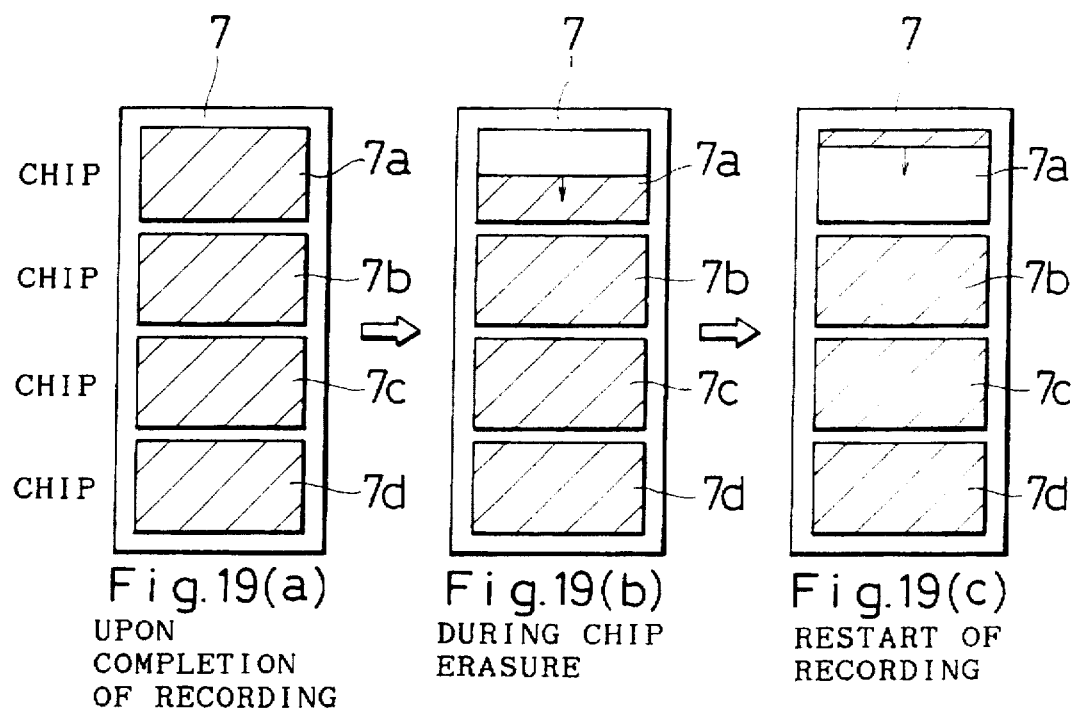

1

RECORDING APPARATUS INCLUDING A PLURALITY OF EEPROMS WHERE PARALLEL ACCESSING IS USED

This application is a continuation of application Ser. No. 08/183,371 filed on Jan. 19, 1994, now abandoned.

BACKGROUND OF THE INVENTION

1. Field of the Invention

The present invention relates to a recording apparatus using a batch erasing type EEPROM.

2. Description of the Related Art

In a recording apparatus for digital data, when it is desired to save recorded digital data for a long period of time, an EEPROM which is a nonvolatile ROM that can be electrically erased and written and which does not lose data if power source is turned off is used as recording medium.

An outline of batch erasing type EEPROM is shown in FIG. 14. As external control signal terminals, there are twenty address signal terminals A0 to A19, eight data input and output terminals D0 to D7, a chip enable terminal bar CE, an output enable terminal bar OE, a write enable terminal bar WE, and a ready busy terminal RY/bar BY. Internal circuits comprise a memory unit 1 of 1 megabyte composed of 16 memory blocks of 64 kilobytes, an address control unit 2 for address control of the memory unit 1, an input and output control unit 3 for data input and output from the memory unit 1, and a chip control unit 4 for controlling the address control unit 2 and input and output control unit 3 using the external control signal terminal bar OE, bar WE and bar CE, and issuing the chip state to outside through RY/bar BY terminal.

An erasing method of memory block is shown in FIG. 15. At step a1, block erasure processing is started. At step a2, a central processing unit (CPU) specifies an arbitrary address in a block for erasing by the address signal terminals A0 to A19, and at step a3, the CPU enters an erasure command from the data input/output terminals D0 to D7. The input of the command is effected by setting both the chip enable terminal bar CE and write enable terminal bar WE at a low level.

At the next step a4, in the similar method, the CPU enters an erasure confirm command. After input of these commands, the RY/bar BY signal remains at low level until completion of erasure. At step a5, it is judged whether erasure is complete or not. When the RY/bar BY signal becomes high level, the erasure processing is over, and the processing ends at step a6. It takes a maximum of 10 seconds from the input of erasure command until completion of erasure of one block.

The method of writing data of one byte into the specified address of the memory unit 1 is shown in FIG. 16. Byte writing process is started at step b1. At step b2, the CPU first specifies the address for writing by the address terminals A0 to A19, and at step b3, the CPU enters a write command from the data input and output terminals D0 to D7. In succession, at step b4, the CPU enters the write data. The RY/bar BY signal remains at low level until the completion of writing. At step b5, it is judged if writing is complete or not. That is, when the RY/bar BY signal becomes high level, writing processing is over, and the processing is terminated at step b6. The time required for writing one byte is 6 to 9 μs.

The EEPROM cannot write data over the address once written, and to write data over the block containing the data it must be erased.

As an example of digital data recording apparatus using this EEPROM, for example, sound recording apparatus Japanese Unexamined Patent Publication (KOKAI) No. 2-238500 (1990) is proposed. Its structure is shown in FIG. 17. The apparatus comprises a microphone 5, an A/D converter 6 for converting the output of the microphone 5 into digital signal, a memory unit 7 for writing the output of the A/D converter 6 in, a D/A converter 8 for converting the read output of the memory unit 7 into an analog signal, a speaker 9 for issuing the output of the D/A converter 8 by electro-acoustically converting, a key input unit 10 possessing various operation switches including record switch and play switch, and a CPU 11 for controlling the memory unit 7 by the signals from the key input unit 10, and reading, writing and erasing them.

The memory unit 7 is composed of four EEPROM chips (hereinafter called chips) 7a to 7d. The sound entered from the microphone 5 is converted into digital signal by the A/D converter 6, and is stored in the memory unit 7. Since the memory unit 7 is nonvolatile, the recorded data is saved if the power source of the apparatus is cut off. This sound recording apparatus is excellent in reliability, portability and durability, as compared with a conventional magnetic tape sound recording apparatus. In addition, this sound recording apparatus uses a small amount of power and is capable of accessing the memory unit randomly.

As one of the recording methods of sound and picture, endless recording is known. The endless recording is a method of recording by sequentially erasing from the region of the recording medium recording the oldest data when the recording medium such as magnetic tape is used up in recording, and recording again in the erased region, thereby continuing to record sound and picture data for a specific time in the past.

Methods of endless recording in a recording apparatus using magnetic tape include a method using an endless tape which is a magnetic tape in a loop form, and a method of recording the face and back side of the cassette alternately and continuously by rotating the magnetic head 180 degrees to the running direction of the magnetic tape near the terminal end of the magnetic tape known as automatic reverse method.

In the sound recording apparatus using an EEPROM, the procedure of recording and re-recording in order to finish recording in all memory regions of the EEPROM, and recording newly by erasing them is shown in FIG. 18. In FIG. 18, reference numeral 12 denotes the space of a memory of EEPROM, and its upper end is the beginning address, and the lower end is the final address. The shaded area denotes the already recorded region, and the blank area shows an erased and recordable region.

In FIG. 18, FIG. 18 (a) denotes the state of completing recording in all memory regions. When recording again in this memory, as shown in FIG. 18 (b), the blocks are erased sequentially from the beginning of the memory as shown in FIG. 18 (b). FIG. 18 (c) is the state of completing the erasure of all blocks. When all memories are erased completely, it is possible to record from the beginning address of the memory as shown in FIG. 18 (d).

In the existing EEPROM, however, the erasure time of one block is very long, 10 seconds at maximum, and plural blocks cannot be erased at the same time, and to erase, for example, completely one chip of the EEPROM composed of 16 blocks in one chip, it takes 2 minutes and 40 seconds at maximum. Accordingly, unless the memory is preliminarily erased when recording, it cannot be used for recording immediately.

Besides, using the sound recording apparatus shown in FIG. 17 relating to the prior art, the case of endless recording is described below while referring to FIG. 19(a) to (c). FIG. 19(a) to (c) shows the recording state of each memory region of chips 7a to 7d of each EEPROM of the memory unit 7. The shaded areas in the chips 7a to 7d in FIG. 9 indicate the data recorded state in the memory regions, and the blank parts are erased of data and are ready to record data. Chips 7a to 7d cannot be written again into the memory region in which data is recorded, and, in order to continue recording after data is recorded in memory regions of all chips 7a to 7d as shown in FIG. 19 (a), it is necessary to erase at least one chip as shown in FIG. 19 (b). In FIG. 19 (b), data of chip 7a is erased. After erasing data of chip 7a, it is possible to record again into the chip 7a erased of data as shown in FIG. 19 (c).

Thus, in the sound recording apparatus using the EEPROM, in performing endless recording, recording is interrupted in order to erase the chip region of the memory when all memory regions of the memory unit 7 are recorded. The chips 7a to 7d of the EEPROM take a maximum time of about 10 seconds for erasing one block which has a memory capacity of 64 kilobytes. Therefore, to erase one chip composed of 16 blocks (memory capacity: 8 megabits), it takes a maximum of 2 minutes and 40 seconds. That is, every time recording into all chips 7a to 7d is over, when erasing one of the chips 7a to 7a and writing again, a pause of 2 minutes and 40 seconds at maximum occurs every time.

SUMMARY OF THE INVENTION

It is a primary object of the invention to present a recording apparatus using EEPROM capable of recording continuously and efficiently without having to wait for erasing process of EEPROM.

To achieve an object of the invention, as shown in a functional block diagram in FIG. 1, a recording apparatus using EEPROM comprising an EEPROM 13 for main recording, a standby EEPROM 14 possessing two recording regions 14a, 14b that can be erased independently of each other, and erasing and writing means 15 for erasing and writing data on these EEPROMs, wherein erasing and writing of the standby EEPROM 14 and erasing and writing of the EEPROM for main recording 13 are executed simultaneously.

The invention, to achieve the object, also provides, as shown in a functional block diagram in FIG. 2, a recording apparatus comprising memory means 16 composed of plural EEPROMs 16a to 16d capable of electrically writing in byte units and erasing in batch in block unit, controlling means 17 for writing and erasing data of the memory means 16 individually in each EEPROM, and detecting means 18 for detecting the memory capacity of the EEPROM in which data is not written in the memory means 16, wherein the controlling means 17 executes the writing process into the EEPROM and the data erasing process of the EEPROM to be written next simultaneously, when the memory capacity detected by the detecting means 18 becomes less than a predetermined capacity, in the case of writing process into the EEPROM of the memory means 16.

The invention further presents a recording apparatus comprising:

memory means composed of plural EEPROMs capable of electrically writing data in byte unit and erasing data in batch in block unit, controlling means for processing writing and erasing of data of the memory means individually in each EEPROM, sound input means for converting sound into data and entering into the controlling means, sound output means for converting the data issued from the controlling means into sound, and detecting means for detecting the memory capacity of the EEPROM having no data written in the memory means, wherein the controlling means executes the writing process into the EEPROM and the data erasing process of the EEPROM to be written next simultaneously, when the memory capacity detected by the detecting means becomes less than a predetermined capacity, in the case of writing process into the EEPROM of the memory means.

The invention moreover presents a recording apparatus comprising:

memory means composed of plural EEPROMs capable of electrically writing data in byte unit and erasing data in batch in block unit, controlling means for processing writing and erasing of data of the memory means individually in each EEPROM, sound input means for converting sound into data and entering into the controlling means, sound output means for converting the data issued from the controlling means into sound, picture input means for converting picture into data and entering into the controlling means, picture output means for converting the data issued from the controlling means into picture, and detecting means for detecting the memory capacity of the EEPROM having no data written in the memory means, wherein the controlling means executes the writing process into the EEPROM and the data erasing process of the EEPROM to be written next simultaneously, when the memory capacity detected by the detecting means becomes less than a predetermined capacity, in the case of writing process into the EEPROM of the memory means.

The operation of the invention is described in FIG. 3. In FIG. 3, reference numeral 19 is a main EEPROM for recording, 20 is a standby EEPROMa, and 21 is a standby EEPROMb. The state in FIG. 3 (a) is the state of completing recording into the main EEPROM 19. At this time, the standby EEPROMa 20 has already been completed erased, and data is written into the standby EEPROMb 21. To record again into the main EEPROM 19 from the state shown in FIG. 3 (a), the erasing and writing means erases the main EEPROM 19. To record data during this erasure, as shown in FIG. 3 (b), the erasing and writing means executes parallel performance of recording into the standby EEPROMa 20 and erasing of the main EEPROM 19. When erasure of the main EEPROM 19 is completed, the erasing and writing means continues recording of data from the beginning address of the main EEPROM 19. At this time, the erasing and writing means erases the standby EEPROMb 21, parallel with recording of the main EEPROM 19. This state is shown in FIG. 3 (c). As shown in FIG. 3 (d), when the erasing and writing means completes recording into the main EEPROM 19, the recording processing is completed. At this time, the standby EEPROMb 21 is completed of erasure, and is ready to accept recording.

To erase and record the main EEPROM 19 again, the erasing and writing means is enough, in the method described above, to process by exchanging the standby EEPROMa 20 and standby EEPROMb 21. That is, as shown in FIG. 3 (e), the erasing and writing means writes into the standby EEPROMb 21 and erases the main EEPROM 19 simultaneously, and consequently, as shown in FIG. 3 (f), records into the main EEPROM 19 and erases the standby EEPROMa 20 simultaneously. The state in FIG. 3 (g) in the completed state of recording again is same as the initial state in FIG. 3 (a), and thereafter erasing and recording can be done by repeating the same steps.

The parallel processing of erasing and writing of the EEPROM by the erasing and writing means can be realized by confirming the erased state of the main EEPROM during the write writing time of the standby EEPROM. A flow chart of parallel processing of writing into the standby EEPROM and erasing of main EEPROM is shown in FIG. 4. When processing is started at step c1 of the main routine, at step c2, the erasing and writing means 15 specifies the write address of the standby EEPROM, and feeds commands and data sequentially at steps c3, c4. Afterwards, until the data is completely written into the standby EEPROM, at step c5, the erasing and writing means 14 executes the erase subroutine of the main EEPROM 19. At step c51, when the erase sub-routine is started, at step c52, the erasing and writing means 15 confirms the erased state of the block of the main EEPROM 19, and if erasure is not complete, the process is shifted to step c6 the main routine through step c57. When erasure of block is complete at step c52, going to step c53, it is judged if the erasure of all blocks of the main EEPROM 19 has been completed or not. When the erasure of all blocks is complete, through step c57, the process is shifted to step c6 of the main routine. If the erasure of all blocks is not complete, going to step c54, the erasing and writing means 15 specifies the next block address of the main EEPROM 19. At step c55, consequently, the erasing and writing means 15 enters the main EEPROM erasure command, and, at step c56, the erasing and writing means 15 enters the main EEPROM erasure confirm command, and the process is shifted to step c6 of the main routine through step c57.

At step c6 of the main routine, it is judged if writing of the data entered by the erasing and writing means 15 at step c4 has been completed or not. If the writing of the input data is complete, moving to step c7, it is judged if an interrupt command of record has been issued by operation key input or the like. If interrupt command of record is not given, returning to step c2, the erasing and writing means 15 writes the next data into the standby EEPROM. At step c7, if interrupt command of record is given, going to step c8, the processing is terminated.

The operation of the invention is described by referring to FIG. 2 and FIG. 5. Memory means 16 is composed of four chips 16a to 16d which are EEPROMs. As shown in FIG. 5 (a), while controlling means 17 is writing into the chip 16d, the memory capacity in which the data is not written by the chip 16d is detected by detecting means 18. When the time required to write data for the memory capacity detected by the detecting means 18 coincides with the time required for erasing of the chip 16a, the controlling means 17 starts erasure of the chip 16a simultaneously with the writing process into the chip 16d. Therefore, when the writing into the chip 16d is over, the erasure process of the chip 17a is over, so that the controlling means 17 can start writing into the chip 16a without having to wait for the erasure of the chip 16a.

Next, as shown in FIG. 5 (b), while the controlling means 17 is writing into the chip 16a, when the time required for writing data corresponding to the memory capacity of the chip 16a detected by the detecting means 18 coincides with the time required for erasure processing of the chip 16b, the controlling means 17 starts erasure processing of the chip 16b simultaneously with the writing process into the chip 16a. Therefore, when writing process into the chip 16a is over, the erasing process of the chip 16b is complete, so that the controlling means 17 can continue the writing process into the chip 16b.

Next, as shown in FIG. 5 (c), while the controlling means 17 is writing into the chip 16b, when the time required for writing data into the memory capacity of the chip 16b detected by the detecting means 18 coincides with the time required for erasing the chip 16c, the controlling means 17 starts erasing of the chip 17c simultaneously with writing into the chip 16b. Therefore, when the write process into the chip 16b is over, the erasing process of the chip 16c is complete, and the controlling means 17 can continue the writing process into the chip 16c.

By repeating such process, it realizes the recording apparatus using EEPROM capable of recording continuously and efficiently without having to wait for the erasing process of the EEPROM.

Thus, by the recording apparatus using EEPROM, the invention enables recording of new data without having to wait for completion of erasure of EEPROM.

According to the invention, when the memory remainder of the EEPROM becomes less than a predetermined capacity, the controlling means carries out simultaneously the writing process into the EEPROM and the erasing process of the memory of the EEPROM to be written in next. Therefore, without need to wait for completion of the erasing process of the EEPROM, the controlling means can process writing continuously. As a result, the recording apparatus using EEPROM capable of recording efficiently is obtained.

BRIEF DESCRIPTION OF THE DRAWINGS

Other and further objects, features, and advantages of the invention will be more explicit from the following detailed description taken with reference to the drawings wherein:

FIGS. 3 (a) to 3 (g) are operation explanatory diagrams of the invention;

FIGS. 5 (a) to 5 (c) are other operation explanatory diagrams of the invention;

FIG. 6 is a structural diagram of a sound recording apparatus in an embodiment of the invention;

FIG. 9 is a structural diagram of a sound recording apparatus in other embodiment of the invention;

FIGS. 10 (a) to 10 (c) are diagrams for explaining the processing of a memory unit 31 shown in FIG. 9;

FIG. 17 is a structural diagram of sound recording apparatus using EEPROM;

FIGS. 18 (a) to 18 (d) are diagrams showing the erasing and recording procedure of the sound recording apparatus shown in FIG. 17; and FIGS. 19 (a) to 19 (c) are diagrams for explaining the endless recording of the sound recording apparatus shown in FIG. 17.

DETAILED DESCRIPTION OF THE PREFERRED EMBODIMENTS

Figure 1:
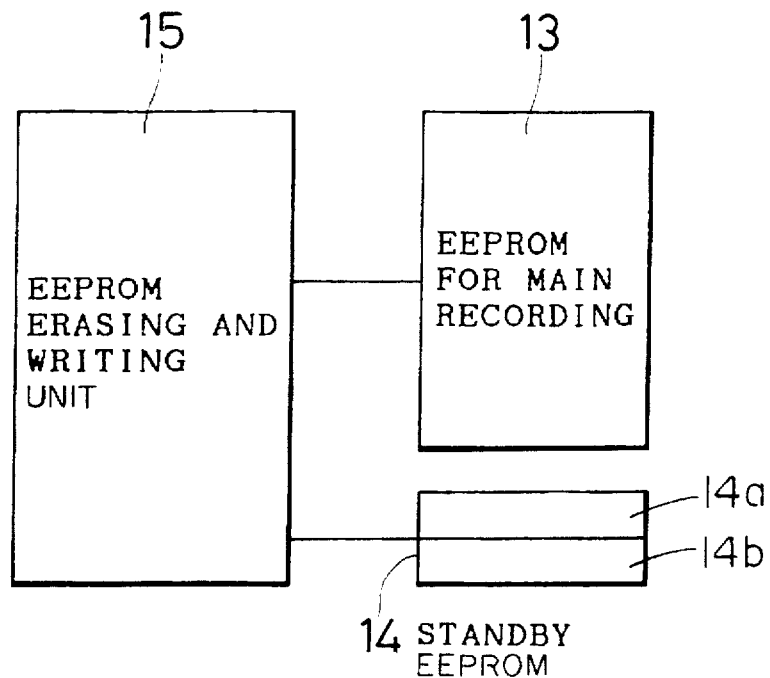
FIG. 1 is a functional block diagram of the invention.
Figure 2:
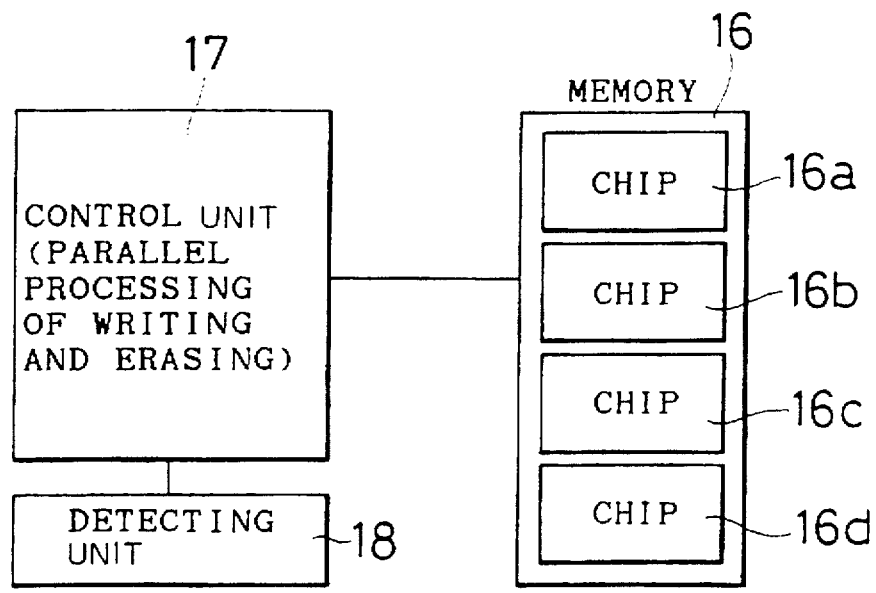
FIG. 2 is other functional block diagram of the invention.
Figure 4:
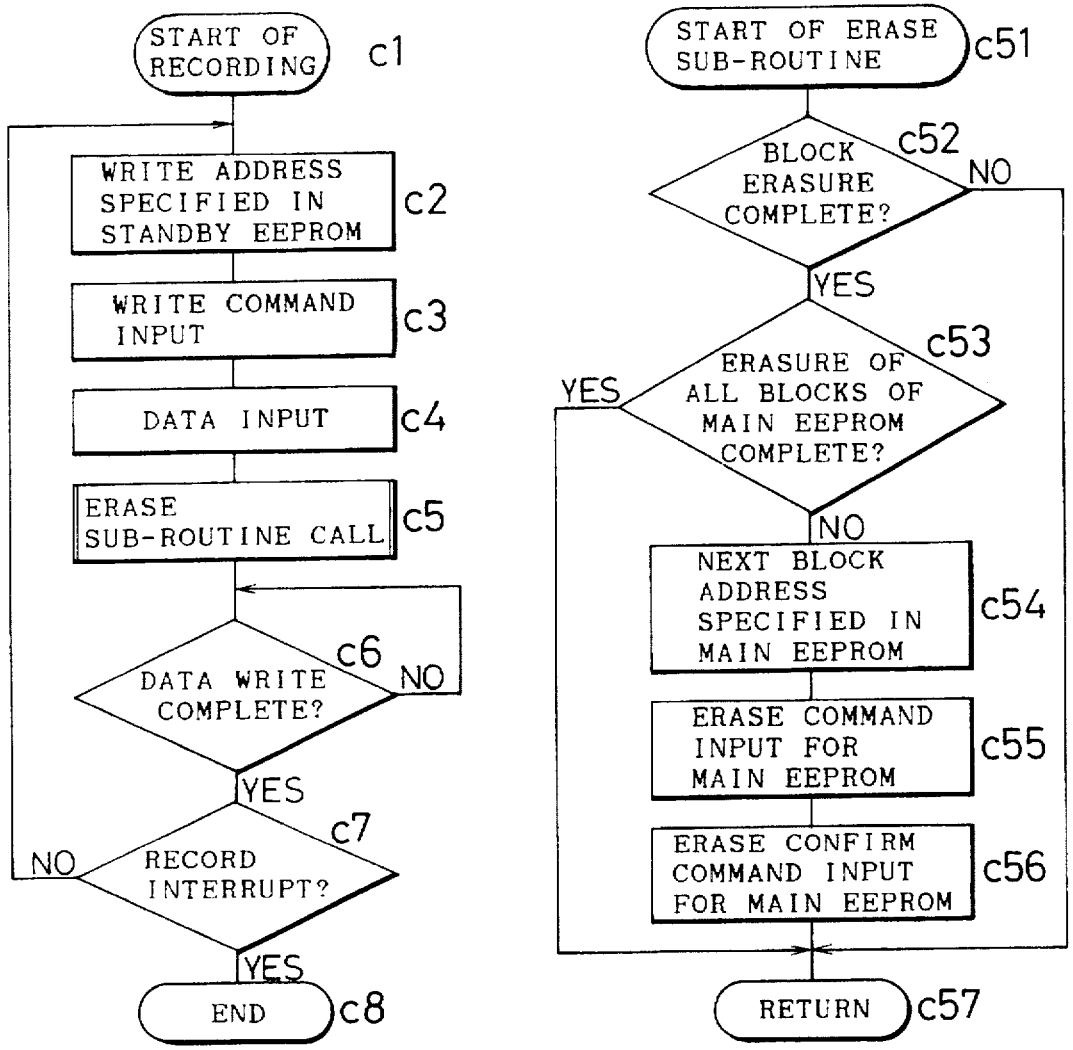
FIG. 4 is a flow chart for explaining the parallel processing of writing into standby EEPROM and erasing of main EEPROM.

Now referring to the drawing, preferred embodiments of the invention are described below.

FIG. 6 is a block diagram showing the electric configuration of a sound recording apparatus in an embodiment of the invention. This sound recording apparatus comprises a microphone 30, an A/D converter 29 for converting the output of the microphone 30 into a digital signal, a main EEPROM 28 in which the output of the converter 29 is written, a standby EEPROMa 22 and a standby EEPROMb 23 in which the output of the A/D converter is written while erasing the main EEPROM 28, a D/A converter 24 for converting the read outputs of these EEPROMs 28, 22, 23 into analog signals, a speaker 25 for converting the outputs of the D/A converter 24 electro-acoustically and producing outputs, a key input unit 26 possessing various operation switches including record switch, play switch and erase switch, and a CPU 27 for controlling the main EEPROM 28, standby EEPROMa 22 and standby EEPROMb 23 by the signals from the key input unit 26, and reading, writing and erasing them.

Explained below is the method of recording and reproducing in the case when the standby EEPROMa 22 is in a ready-to-record state. After completion of recording into the main EEPROM 28, when an erase command is sent into the main EEPROM 28 from the key input unit 26, the CPU 27 executes the erasure action of the main EEPROM 28 sequentially from the beginning block of the main EEPROM 28. During erasure, if a record command is given from the key input unit 26, the CPU 27 records into the standby EEPROMa 22, simultaneously with the erasing process of the main EEPROM 28. After completion of erasure of the main EEPROM 28, recording into the main EEPROM 28 and erasing of the standby EEPROMb 23 are conducted at the same time.

To reproduce the recorded data, first, the data recorded in the standby EEPROMa 22 is readout, and is reproduced by the speaker 25 through the A/D converter 24. Next, reading out the data recorded in the main EEPROM 21, it is similarly reproduced by the speaker 24 through the A/D converter.

The capacity of standby memory is determined depending on the erasure time of the EEPROM chips for composing the main memory and the data writing speed. For example, the sound compressed at bit speed of 13 kbps is stored in the main memory composed of EEPROM chips of 1 megabyte. The time required for erasing the EEPROM of 1 megabyte composed of 16 blocks is, as mentioned above, 2 minutes and 40 second at maximum. The memory capacity necessary for recording corresponding to this erasing time is 13 kbps×160 seconds=260 kilobytes, and by doubling this figure, the capacity of the standby EEPROM is 520 kilobytes.

When erasing of one chip of the main memory is over, while recording in this erased chip, the other chips are erased, and therefore it is not necessary to increase the capacity of the standby EEPROM if the number of chips for composing the main memory increases.

Figure 7:
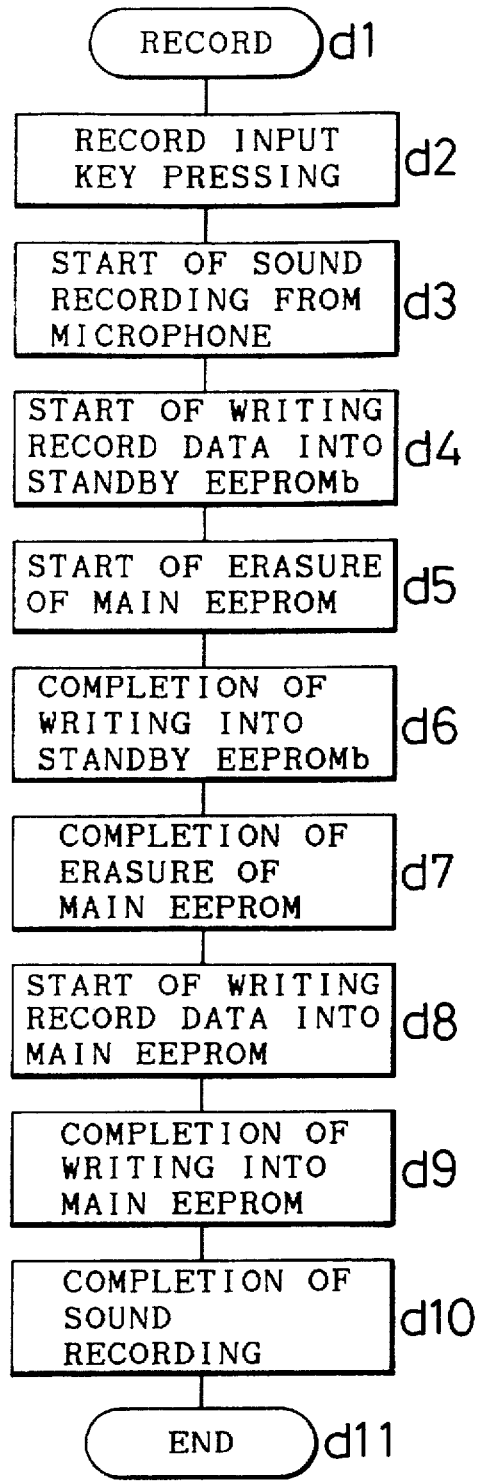
FIG. 7 is a flow chart showing the recording process of the sound recording apparatus shown in FIG. 6.

FIG. 7 is a flow chart showing the processing procedure in the case of recording by the sound recording apparatus shown in FIG. 6. Suppose data is preliminarily recorded in the main EEPROM 28 and standby EEPROMa 22. The process is started at step d1. At step d2, the record switch of the key input unit 26 is pressed. At step d3, feeding sound from the microphone 30, the sound data is converted into digital signals by the A/D converter 29, and at step d4, the data is written into the standby EEPROMb 23 as recorded data. At the same time, at step d5, erasing process of the recorded data in the main EEPROM 28 is started. At step d6, writing process into the standby EEPROMb 23 is completed, and, at step d7, erasing process of the main EEPROM 28 is completed at the same time.

Consequently, at step d8, the CPU 27 starts writing process of the recorded data into the main EEPROM 28, and the writing process is over at step d9. At step d10, the sound recording is completed, and the processing is terminated at step d11. Thus, if data is already recorded in the main EEPROM 28 and standby EEPROMa 22, the CPU 27 is not necessary to wait for erasure of the main EEPROM 28, and performs the operation of recording sound.

Figure 8:
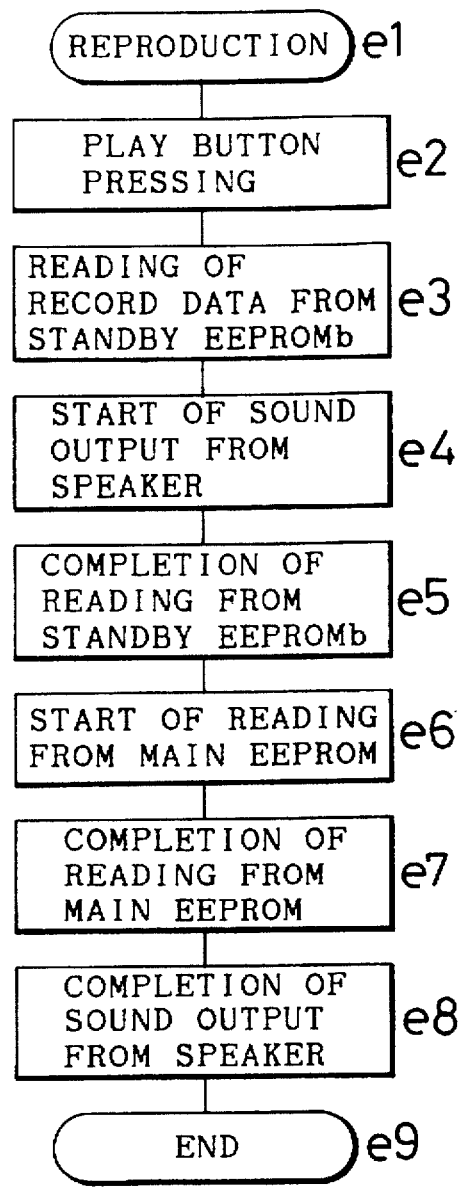
FIG. 8 is a flow chart showing the reproducing process of the sound recording apparatus shown in FIG. 6.

FIG. 8 is a flow chart showing the processing procedure for reproducing the data recorded in the sound recording apparatus shown in FIG. 6. Data is preliminarily recorded in the main EEPROM 28 and standby EEPROMa 22. Process is started at step e1. At step e2, the play switch in the key input unit 26 is pressed. At step e3, the recorded data is read out from the standby EEPROMb 23, and converted into analog signal by the D/A converter 24, so that the sound can be heard through the speaker 25. At step e5, reading of recorded data from the standby EEPROMb 23 is completed, and at step b6, the CPU 27 starts reading out the recorded data from the main EEPROM 28. At step e7, reading from the main EEPROM 28 is completed, and at step e8, the sound output from the speaker 25 is over, and the reproduction is terminated at step e9.

FIG. 9 is a block diagram showing an electric configuration of a sound recording apparatus in another embodiment of the invention. The sound signal entered from a microphone 39 is converted from analog signal into digital signal in an A/D converter 40, and is stored in a memory unit 31 by a CPU 37. When reproducing the data stored in the memory unit 31, the CPU 37 reads out the reproduction data from the memory unit 31, and the digital data is converted into analog signals by a D/A converter 34, so that the sound can be heard from a speaker 35. A key input unit 36 comprises record switch, play switch, erase switch, endless record switch and others, and when each switch is pressed down, the CPU 37 judges which switch has been pressed, and processes accordingly.

The memory unit 31 comprises four EEPROM chips 31a to 31d, and the CPU 37 individually reads/writes/erases the data of the chips 31a to 31d. A memory remainder detecting circuit 38 detects that the memory capacity in which data is not recorded in the memory unit 31 (hereinafter called the memory remainder) becomes smaller than a predetermined capacity, and the CPU 37 reads its detection signal.

In this sound recording apparatus, when the endless record switch is turned on, the CPU 37 starts recording in the memory unit 31, and the memory remainder is detected by the memory remainder detecting circuit 38. For example, when writing data into the chip 31d as shown in FIG. 10 (a), if it is detected by the memory remainder detecting circuit 38 that the memory remainder becomes less than the predetermined capacity, the CPU 37 starts erasure of data of the chip 31a. Simultaneously when writing of data into the chip 31d is over, the erasure of data of the chip 31a is completed.

In consequence, the CPU 37 starts to write into the chip 31a as shown in FIG. 10 (b), and while writing, if the memory remainder detecting circuit 38 detects that the memory remainder has becomes less than the predetermined capacity, the CPU 37 starts erasure of data of the chip 31b. When writing into the chip 31a is over, the erasure of data of the chip 31b is completed.

Next, as shown in FIG. 10 (c), the CPU 37 starts writing into the chip 31b, and while writing, if the memory remainder detecting circuit 38 detects that the memory remainder has become less than the predetermined capacity, the CPU 37 starts erasure of data of the chip 31c. When writing into the chip 31b is over, the erasure of data of the chip 31c is completed. By repeating such process, there is no waiting time for erasing the chips 31a to 31d, so that endless recording without interruption in recording is realized.

The memory remainder for starting erasure process of data is determined in relation to the erasing time of one chip and the recording speed of tape. The following is an example of recording the sound sampled at 8 kHz by the sound compression format employed in the European digital cellular system (RPE-LTP). The data recording speed is 13 kbps, and the recording quantity in the required erasure time of one chip of 2 minutes and 40 seconds is 260 kilobytes. That is, when the memory remainder detecting circuit 38 detects the memory remainder of 260 kilobytes, erasure of the chip to be written in next is started. Therefore, when the memory remainder of the presently recorded chip becomes 260 kilobytes, and the memory remainder of other chips is zero, the endless recording can be continued by erasing the next chip, that is, the chip in which the oldest data is recorded.

Figure 11:
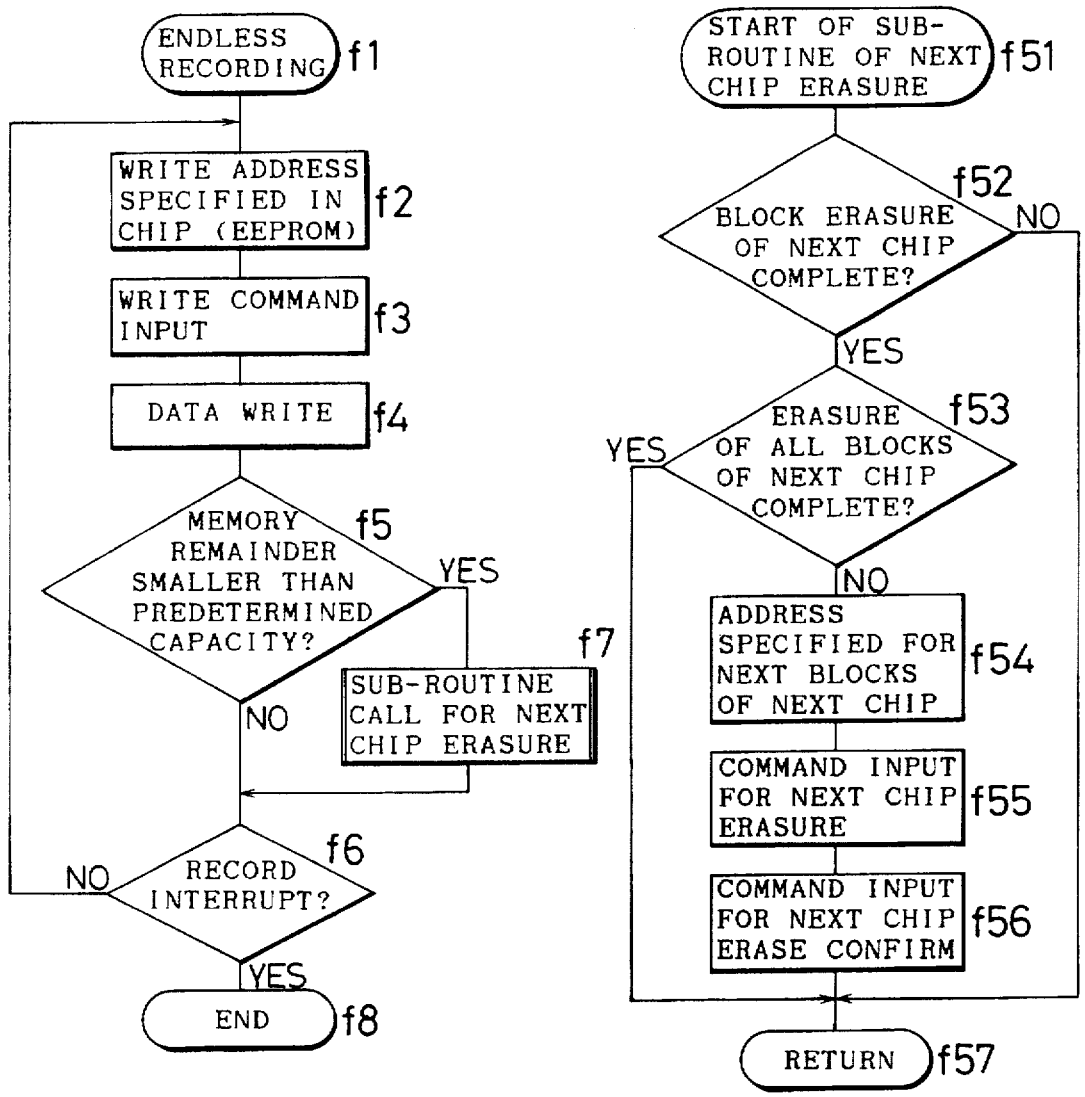
FIG. 11 is a flow chart showing the endless recording process of the sound recording process of the sound recording apparatus shown in FIG. 9.

FIG. 11 is a flow chart showing the processing procedure in the sound recording apparatus shown in FIG. 9 in the case of endless recording. Processing starts at step f1 of the main routine. At step f2, the CPU 37 specifies the chip writing address, and, at step f3, the CPU 37 enters a chip write command. At step f4, the CPU 37 writes the data of predetermined quantity into the chip. At step f5, the memory remainder detecting circuit 38 judges whether the memory remainder is smaller than the predetermined capacity or not. When the memory remainder is not less than the predetermined capacity, the process is shifted to step f6, and when less than the predetermined capacity, the operation goes to step f51 of the sub-routine through step f7. At step f6, it is judged if a record interrupt command is issued by operation key input or not. If record interrupt command is not issued, returning to step f2, the CPU 37 writes next data into the chip. At step f6, if record interrupt command is issued, the process is shifted to step f8 and is terminated.

At step f51, the erasure sub-routine of the chip to be written in next (hereinafter- called the next chip) is started. At step f52, the CPU 37 judges if the erasure of block of the next chip is complete or not, and if the erasure is not complete, the process is shifted to step f6 of the main routine through step f57. If the block erasure is not complete at step f52, the process is shifted to step f53, and the CPU 37 judges if erasure of all blocks of the next chips is complete or not. When all blocks are erased, the process is shifted to step f6 of the main routine through step f57. If erasure of all blocks is not complete at step f53, the process is shifted to step f54, and the CPU 37 specifies the address of the next block of the next chip. At step f55, the CPU 37 enters an erasure command of the next chip. At step f56, the CPU 37 enters an erasure confirm command of the next chip, and the processing is shifted to step f6 of the main routine through step f57.

Figure 12:
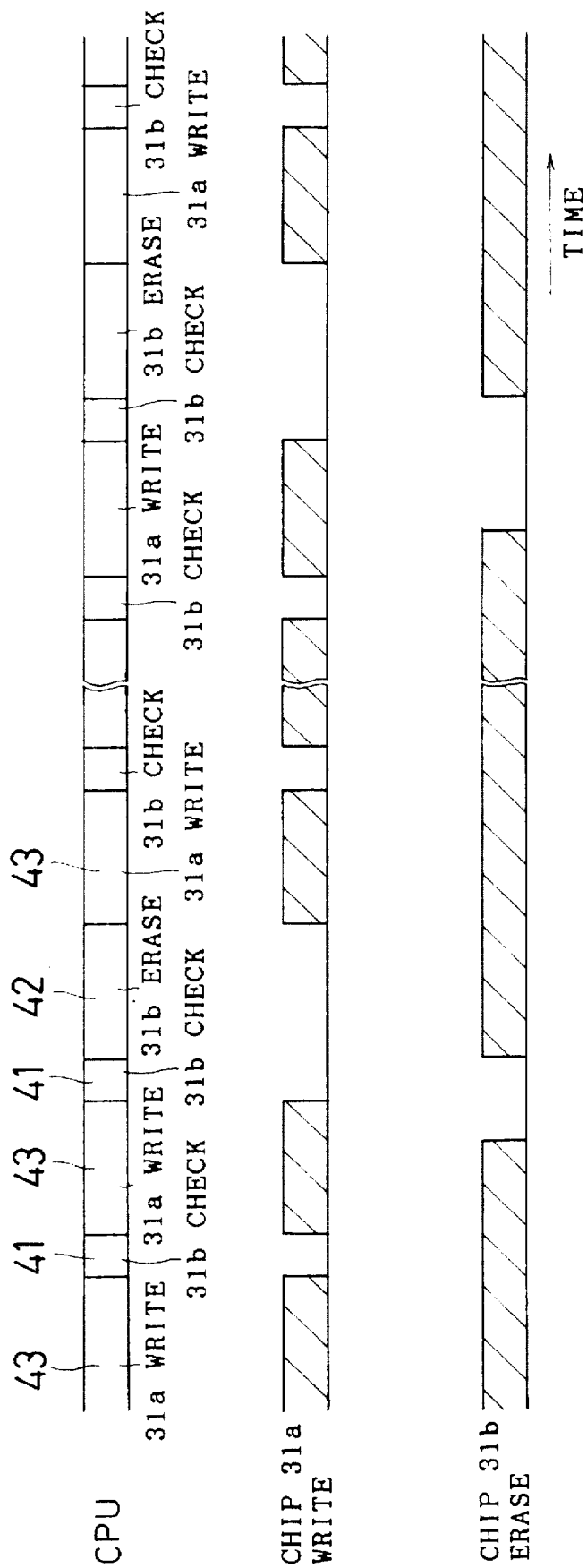
FIG. 12 is a time chart showing the processing operation of a CPU 37 shown in FIG. 9.

FIG. 12 shows the operation status of chip 31a and chip 31b in the case of erasure process of the chip 31b simultaneously with the writing process into the chip 31a by the CPU 37. The shaded areas in FIG. 12 indicate the active state of the chips 31a, 31b. When the CPU 37 performs writing process 43 into the chip 31a and erasing process into the chip 31b at the same time, the CPU 37 preliminarily writes 43 a predetermined data quantity into the chip 31a, and every time the writing process 43 is over, it is checked 41 if the erasure of block unit of the chip 31b is complete or not. If the erasure of the block unit of the chip 31b is not complete, the CPU 37 continues the writing process 43 into the chip 31a. Alternatively, the CPU 37, if erasure of block unit of the chip 31b is complete, gives an erasure command 42 of next block to the chip 31b, and performs writing process 43 of the chip 31a.

Figure 13:
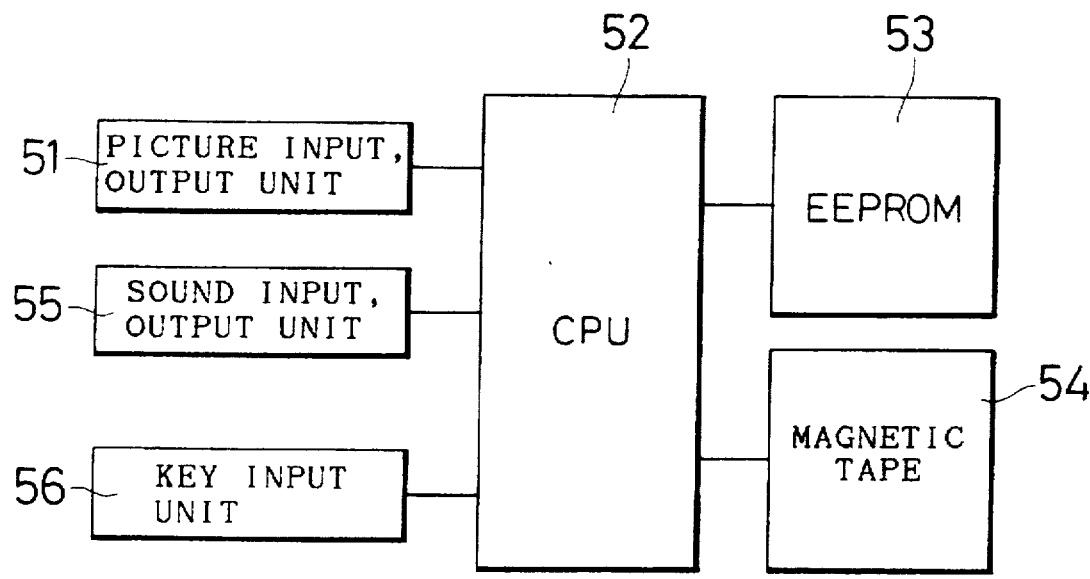
FIG. 13 is a structural diagram of picture and sound recording apparatus in a different embodiment of the invention.
Figure 14:
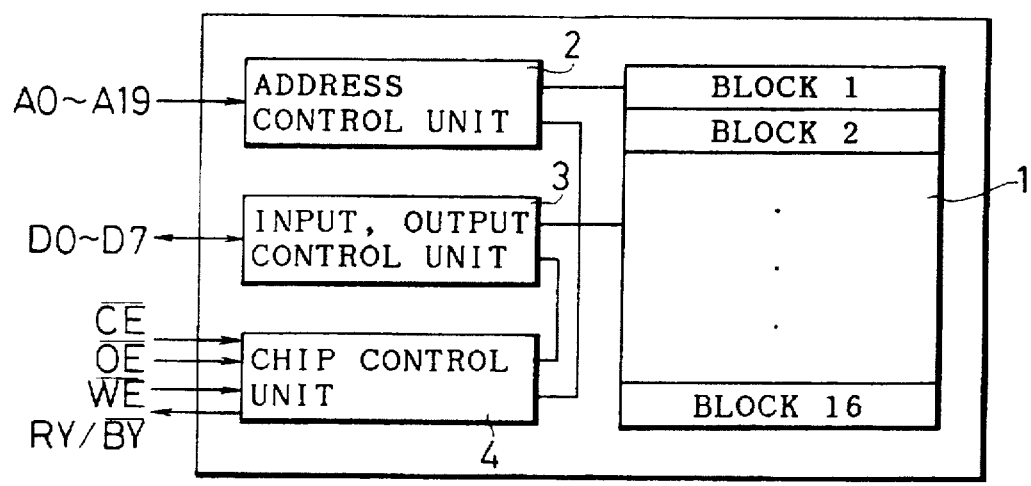
FIG. 14 is a schematic time of a batch erasing time EEPROM.
Figure 15:
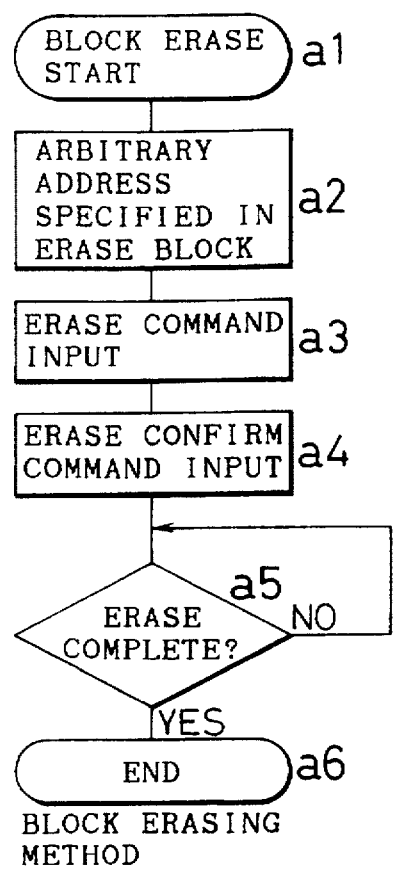
FIG. 15 is a flow chart showing the block erasing method of the EEPROM.
Figure 16:
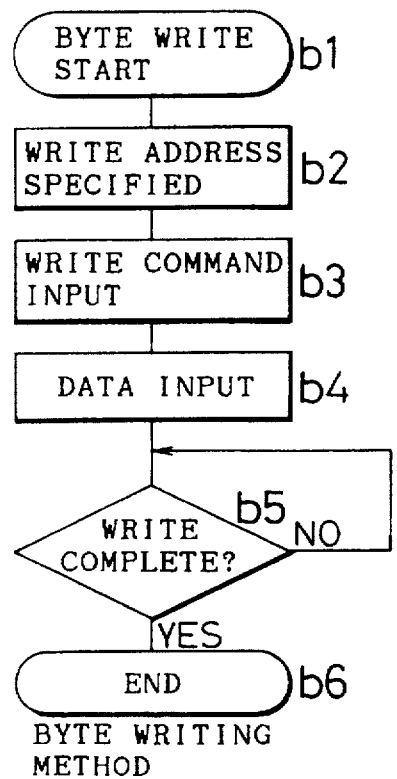
FIG. 16 is a flow chart showing the byte writing method of EEPROM.

FIG. 13 is a block diagram showing an electric configuration of a picture and sound recording apparatus in a different embodiment of the invention. Picture data entered through a picture input and output unit 51 is recorded in an EEPROM 53 or magnetic tape 54 by a CPU 52. The picture data recorded in the EEPROM 53 or magnetic tape 54 is delivered into the picture input and output unit 51 by the CPU 52, and is reproduced as an image. Sound data entered through a sound input and output unit 55 is recorded in the EEPROM 53 or magnetic tape 54 by the CPU 52. The sound data recorded in the EEPROM 53 or magnetic tape 54 is issued to the sound input and output unit 55 by the CPU 52, and is reproduced as sound. By the signal from a key input unit 56, the CPU 52 reads, writes, and erases the EEPROM 53 and magnetic tape 54.

This recording apparatus performs endless recording for one hour of the picture data and sound data into the EEPROM 53 by the CPU 52, except when recording into the magnetic tape 54. Therefore, if the user connect this recording apparatus to a television receiver, and desires to watch again the past scene while observing the television screen, if the scene is within an hour back from the present, the past scene can be reviewed, if not recorded in the magnetic tape 54, which is very convenient. To save the scene for a long time, moreover, it is possible only by recording the data recorded in the EEPROM 53 into the magnetic tape 54.

In the case of endless recording by using magnetic tape in this manner, there is a problem in the durability since the magnetic tape and the recording head are in contact with each other. However, the existing EEPROM is capable of erasing and rewriting more than 100,000 times, and if data for one hour is continuously recorded in the EEPROM by endless recording, it is possible to record for about 100,000 hours (about 11 years), which is sufficient for the durability.

The embodiments are described herein, but the invention is not limited to the sound recording apparatus alone, but it may be applied to any apparatus for recording data in real time in EEPROM, such as moving picture recording apparatus using EEPROM.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A recording apparatus including a plurality of EEPROMs comprising:

a main EEPROM for main recording, means for detecting a memory capacity of memory means of the plurality of EEPROMs in which data was not written, a standby EEPROM having first and second recording regions, and means in response to detecting for erasing data from the main EEPROM at the same time as writing data into the first region of the standby EEPROM and for writing data into the main EEPROM at the same time as erasing data in the second region of the standby EEPROM, when the memory detected by the detecting means becomes less than a predetermined capacity, during a process of writing data into the EEPROMs.

2. The recording apparatus according to claim 1 further comprising:

sound input means for converting sound into sound data and entering the sound data into controlling means, and sound output means for converting sound data emitted from the controlling means into sound.

3. The recording apparatus according to claim 1, further comprising:

sound input means for converting sound into sound data and entering the sound data into a controlling means, sound output means for converting sound data emitted from the controlling means into sound, picture input means for converting pictures into picture data and entering the picture data into the controlling means, picture output means for converting picture data emitted from the controlling means into pictures.

4. The recording apparatus of claim 2, wherein the controlling means simultaneously executes erasing of data in another EEPROM chip, said another EEPROM being a next EEPROM where data is written.

5. The recording apparatus of claim 3, wherein the controlling means simultaneously executes erasing of data in another EEPROM chip, said another EEPROM chip being a next EEPROM chip where data is written.

6. The recording apparatus of claim 1, wherein the main EEPROM for main recording includes units of bytes partitioned into plural memory blocks wherein individual memory blocks can be batched erased.

7. The recording apparatus of claim 2, wherein the chips include units of bytes partitioned into plural memory blocks wherein individual memory blocks can be batched erased.

8. The recording apparatus of claim 3, wherein the EEPROM chips include units of bytes partitioned into plural memory blocks wherein individual memory blocks can be batched erased.

* * * * *